United States Patent [19]
Yang

[11] Patent Number: 5,507,931
[45] Date of Patent: Apr. 16, 1996

[54] SPUTTER DEPOSITION PROCESS

[75] Inventor: Peter Y. Yang, San Diego, Calif.

[73] Assignee: Deposition Technologies, Inc., San Diego, Calif.

[21] Appl. No.: 394,353

[22] Filed: Feb. 24, 1995

Related U.S. Application Data

[63] Continuation-in-part of Ser. No. 175,744, Dec. 30, 1993, abandoned.

[51] Int. Cl.$^6$ .......................... C23C 14/34; C23C 14/35
[52] U.S. Cl. .................. 204/192.15; 204/192.12; 204/192.26; 204/298.11; 204/298.12; 204/298.16; 204/298.24; 204/298.26
[58] Field of Search .................. 204/192.12, 192.15, 204/192.26, 298.09, 298.11, 298.12, 298.16, 298.24, 298.26

[56] References Cited

U.S. PATENT DOCUMENTS 3,799,862  3/1974  Krutenat ........................ 204/298.06
4,322,276  3/1982  Meckel et al. ..................... 204/192.26
5,158,660  10/1992  Devigne et al. ................... 204/298.21
5,415,756  5/1995  Wolfe et al. ..................... 204/192.23

FOREIGN PATENT DOCUMENTS

2528108  12/1976  Germany ........................ 204/298.09
53-43905  11/1978  Japan ........................... 204/298.09

*Primary Examiner*—Aaron Weisstuch
*Attorney, Agent, or Firm*—Juettner Pyle Lloyd & Piontek

[57] ABSTRACT

Magnetron cathode reactive sputtering of oxides and nitrides of bismuth, tin, gallium, and their alloys is significantly enhanced by melting the metal and reactively sputtering the molten metal, continuously removing from the sputtering surface of the molten metal oxides or nitrides formed on the sputtering surface, and moving the oxides or nitrides to an area or place outside of or removed from the sputtering plasma zone. The metal sputtering surface is thereby maintained in a clean condition to reduce the potential for arcing and to substantially increase the rate of sputtering of the metal. Sputter deposition rates and the speed of production of compound coated substrates are thereby increased several fold.

16 Claims, 5 Drawing Sheets

SPUTTER DEPOSITION PROCESS

CROSS REFERENCE

This is a continuation-in-part of application Ser. No. 08/175,744 filed on Dec. 30, 1993, now abandoned.

FIELD OF THE INVENTION

The present invention relates to the art of sputter deposition of coatings onto substrates, and especially high speed reactive sputter deposition of compounds of metals having relatively low melting temperatures. The invention has particular application to magnetron cathode reactive sputtering of oxides and nitrides of bismuth, tin, gallium and their alloys.

BACKGROUND

Magnetron sputter deposition is a well-known method of applying coatings onto substrates, especially large glass sheets and continuous films or webs of polymeric substrate materials, intended for various applications, such as solar control window films, optically enhanced holograms, transparent anti-static packaging, large scale solar energy collectors and solar cells, electromagnetic interference shielding, etc.

Figure 1:
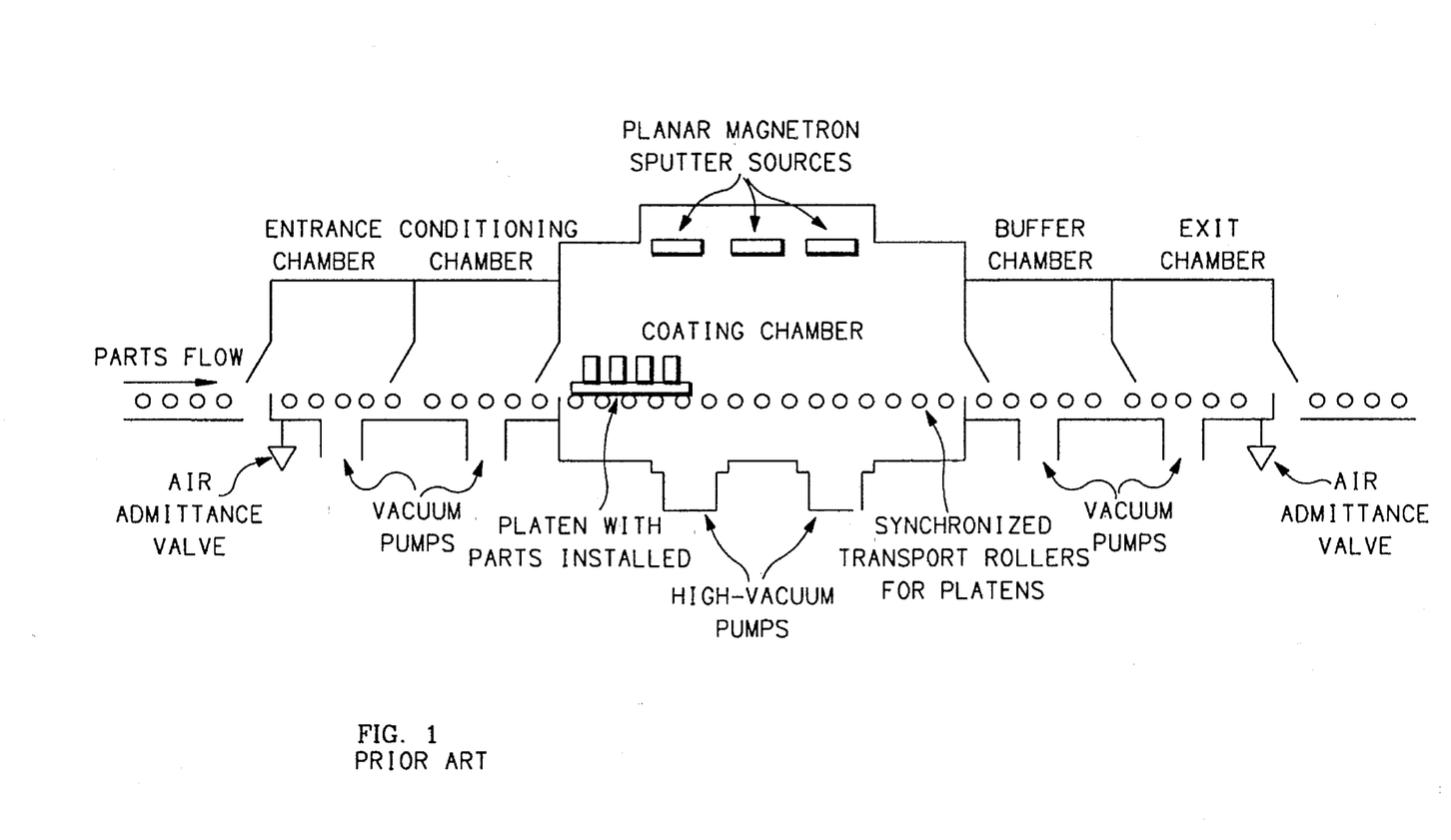
FIG. 1 is a schematic illustration of a commercial coating line employing conventional planar cathodes.
Figure 2:
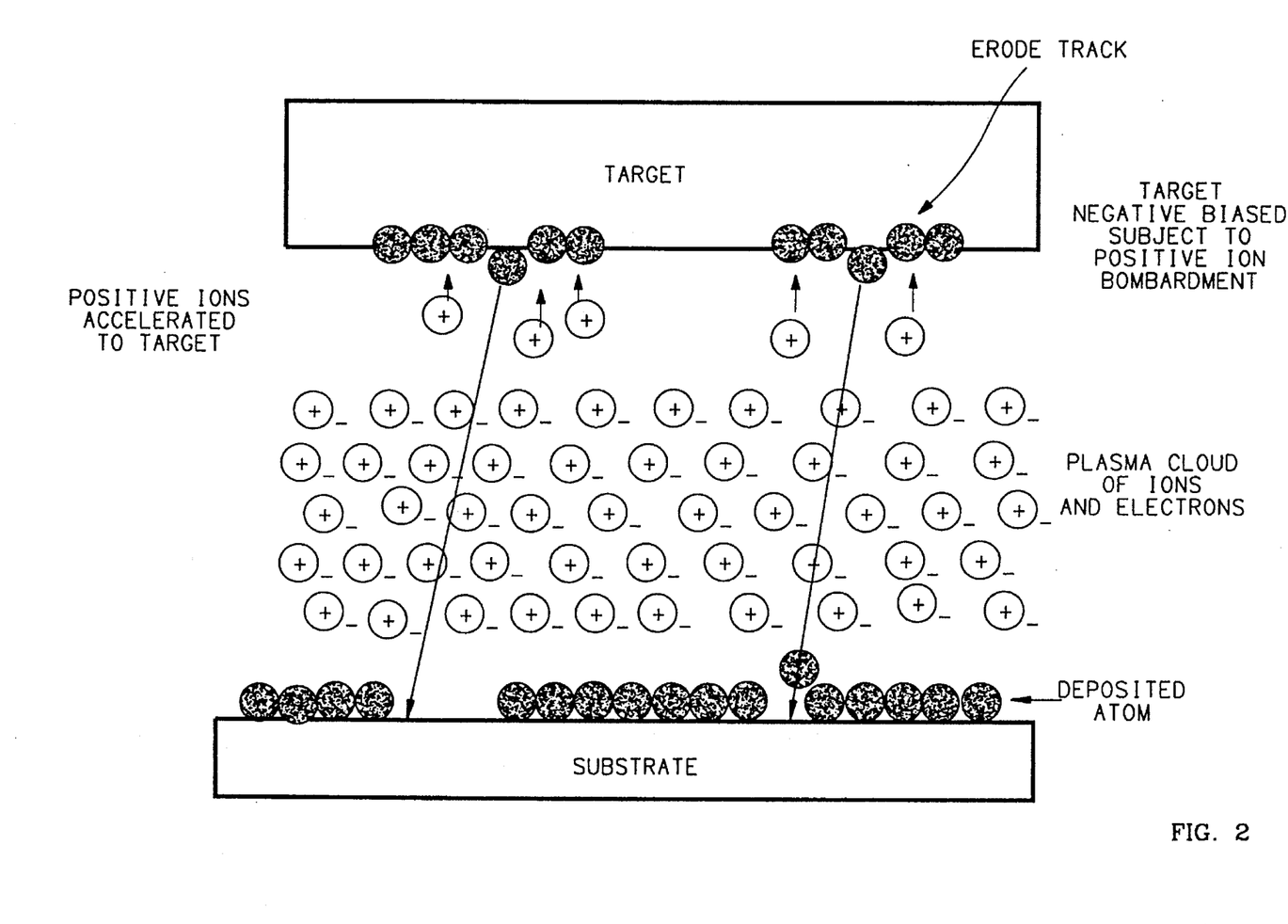
FIG. 2 is a simplified schematic illustration of the sputter deposition process.

In the accompanying drawings, FIG. 1 illustrates a conventional commercial coating line utilizing conventional planar magnetron sputtering cathodes. FIG. 2 illustrates schematically, in a slightly different setting and in a very simplified manner, the sputtering process. In brief, the coating material to be sputtered is mounted as a negatively biased target on the surface of the cathode element of the magnetron and a substrate material to be coated is moved along a path opposite the target. Conventional sputtering may occur upwardly, downwardly or horizontally, as desired, i.e., FIG. 2 may be viewed right side up, on its side, or upside down, all with equal effect.

In nonreactive sputtering, the sputtering chamber is evacuated, argon or other inert gas is introduced, the substrate is started in motion, the magnetron is energized, and the inert gas molecules begin a cascade ionization process and form between the target and the substrate a plasma cloud of ions and electrons which, in the core of the plasma cloud, have equal amounts of positive and negative charges. The positively charged ions at the plasma cloud edge, driven by the electric field, leave the plasma cloud and move toward the target surface and bombard the target material with high energy impact, thereby causing the target to disintegrate atom-by-atom and to be driven and redeposited atom-by-atom onto the substrate. The process produces a uniform and strongly adherent coating which is resistant to abrasion, peeling and cracking.

In reactive sputtering, one or more active gases capable of reacting with the target material are introduced into the sputtering chamber along with the inert gas. The active gas molecules react with the sputtered atoms of target material as they travel through the plasma cloud and impinge on the substrate thereby to form a desired compound coating on the substrate, e.g., an oxide or a nitride of the sputtered metal.

Inherently, the same chemical reaction takes place on the exposed surface of the target, which creates serious problems in terms of process control. Because the sputtering rate is usually substantially lower for the compound than the corresponding base metal, the total sputtering rate will be gradually reduced to a much lower level in the presence of the active species, commonly called "target poisoning". Also in most cases, the compound has very poor electrical conductivity and severe arcing problems inevitably develop. As the compound forms on the target surface, one or more localized points of low conductivity are formed and a static charge builds up eventually resulting in a high energy arc which, like a bolt of lightning, sinks a large current to a small area, evaporates the target at that point and causes vapor deposition onto the substrate of nonuniform droplets of much greater size than the sputtered atoms. This causes an unacceptably rough or bumpy coating on the substrate and disrupts the sputtering process. When severe arcing occurs, the power must be shut off to quench the arcing. This results in discontinuous production runs, loss of time and waste of materials. Arcing is especially difficult to control in reactive sputtering with oxygen, and in many cases makes reactive sputtering unmanageable and nonproductive.

In order to cope with the arcing problem, the industry relied for a time on RF sputtering to deposit nonconductive films. However, RF sputtering is too slow for profitable coating in large scale production.

Figure 3:
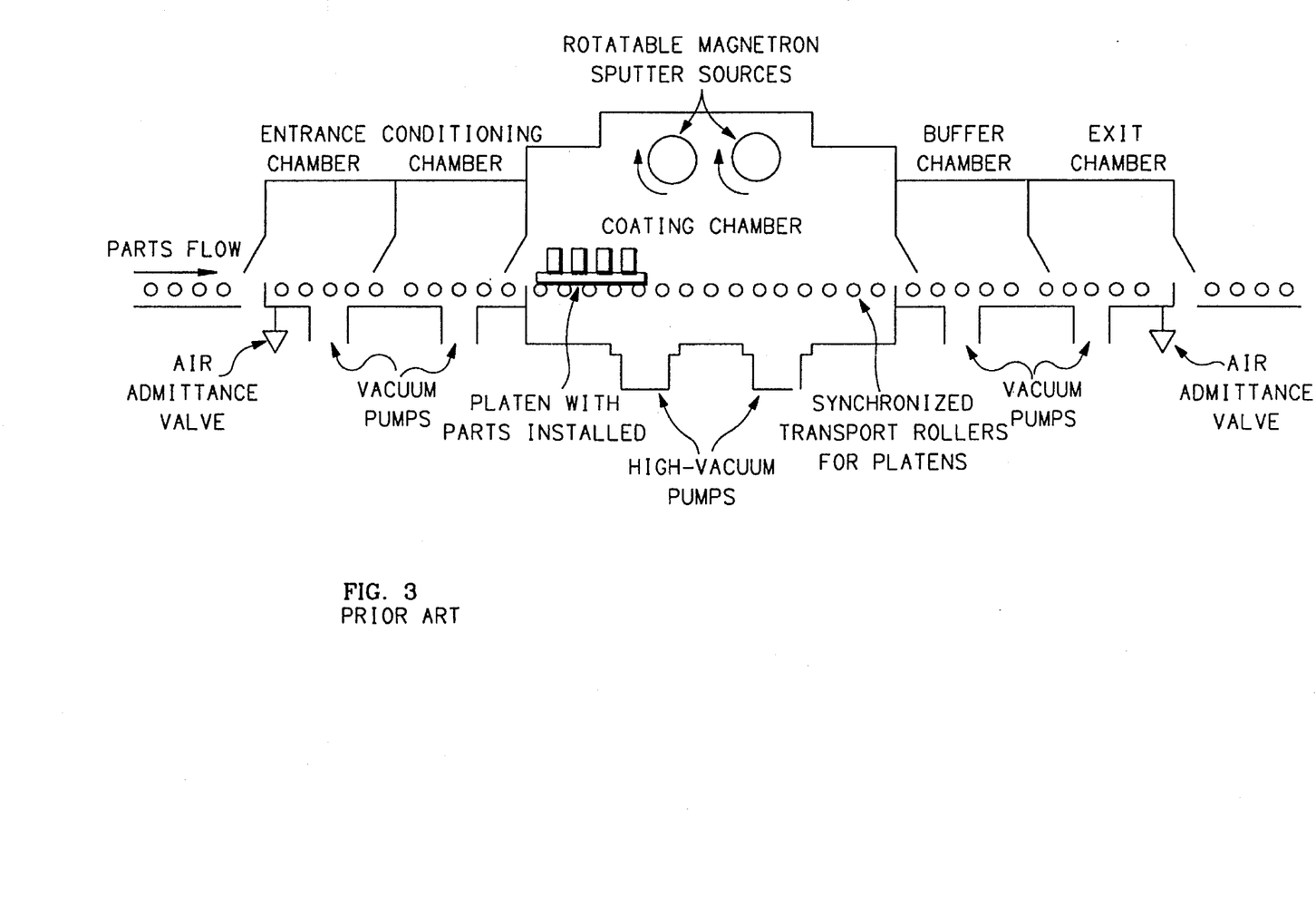
FIG. 3 is a schematic illustration of a sputtering line employing tubular rotatable cathodes.

Presently, the vacuum coating industry prefers to use rotary target systems such as those available from Airco under the trademark "C-MAG". In this system, as illustrated in FIG. 3, one or more rotatable target tubes are cooled internally with coolant so the cathode can handle high sputtering powers. As the target or targets rotate slowly, the segment of the cylindrical surface exposed to the plasma is sputtered and previously sputtered surface areas are rotated out of the reaction zone. When entering into the sputtering zone, previously formed nonconductive surface areas are cleaned by the sputtering process before they build up excessively and cause severe arcing. The self cleaning of the rotating target tube or tubes thus reduces severe arcing frequency and renders the process much easier to manage.

However, the rotary target tube system is not an efficient system for deposition of low melting point metals because the power and thus the sputtering rate must be maintained at a relatively low level to prevent melting of the target tube and dropping of metal out of the target. Deposition of low melting temperature metal compounds, e.g., oxides and nitrides of bismuth, tin, gallium and their alloys is especially troublesome because of the low melting point and poor thermal conductance.

Relative to another aspect of the invention, it is observed that the art includes disclosures of deposition processes involving the use of a wholly or partially liquid or molten target, namely, U.S. Pat. No. 3,799,862 to Krutenat, Japanese patent document 53-43905 and German patent publication 2528108 to Kausche et al. The Krutenat system cannot be used for reactive sputtering because the filament which is an integral part of the system would burn out in a reactive plasma. The Japanese publication employs a RF power supply to override a DC power supply to start and sustain the sputtering process, which for commercial production would be prohibitively expensive and inefficient. Kausche proposes a continuous supply of a large volume of liquid material to be sputtered, which likewise would be prohibitively expensive and inefficient. Moreover, none of these disclosures addresses either the arcing problem or the problem of reduced sputtering capacity due to the formation of a nonconductive blanket or crust of metal compound on the surface of the liquid metal once sputtering commences. Process control would therefore rapidly degenerate to an unmanageable condition.

To the best of the applicant's information and belief, there were no liquid or molten target sputtering processes in commercial use at the time of the present invention.

SUMMARY OF THE INVENTION

The present invention resides in the discovery and development of a system and apparatus for sputtering low melting temperature metals in liquid or molten state and for rendering the molten metal self cleaning during reactive sputtering so that the low melting temperature metal can be sputtered in the liquid state and the reaction product deposited at a much higher power level and a much faster and more controllable rate of deposition than previously known. The invention is especially devised for reactive sputter deposition of oxides and nitrides of bismuth, tin, gallium, and their alloys.

The resultant increase in the permissible rate of deposition of these compounds is astonishing and could not have been anticipated. With the target metal in liquid state and continuously presenting a clean liquid metal surface to the sputtering forces, the rate of reactive deposition of the compounds can be increased many times over without incurring unmanageable arcing or other process disruptions.

The invention thereby provides a process for very substantially increasing the rate of deposition, and very drastically decreasing the production time and cost, for depositing onto substrates a very uniform and metallurgically consistent compound coating, especially oxides and nitrides of bismuth, tin, gallium, and their alloys. Moreover, the coating may comprise either a conventional metal compound or a synthetic compound.

The invention achieves these remarkable advantages with only minor modifications to the sputtering equipment and no departure at all from standard sputter deposition operating conditions.

In accordance with the invention, the only modification required in the sputtering apparatus is to utilize a planar magnetron sputtering cathode mounted horizontally for upwardly directed sputtering and to equip the same with a specially designed backplate and shield assembly which, in combination with the magnetic and sputtering forces extant in the sputtering chamber, provides an upwardly facing, active, self-cleaning liquid or molten metal surface from which the metal is sputtered, and an inactive, non-sputtering area or space outside the influence of the plasma cloud into which the oxide or nitride crust forming on the metal during sputtering is moved.

Because the oxide or nitride crust is continuously flushed from the active surface of the molten metal and moved to an inactive, non-sputtering shielded area or space outside the influence of the plasma cloud, the crust does not impede or decrease the rate of metal sputtering, does not create a condition for the build-up of excessive static charges, and does not subsequently cause unmanageable arcing.

Thus, the process of the invention can be practiced very efficiently, effectively and advantageously.

These and other objects and advantages of the invention will become apparent from the following detailed description, as considered in conjunction with the accompanying drawings.

DETAILED DESCRIPTION

The following is a detailed description of preferred embodiments of the invention presently deemed by the inventor to be the best mode of carrying out the invention.

With reference to the drawings, FIGS. 1 to 3 have been included in the disclosure for purposes of convenient illustration of conventional sputter deposition technology, which has been described in the foregoing Background. Apparatus preferred for practice of the invention is illustrated schematically in FIG. 4.

Figure 4:
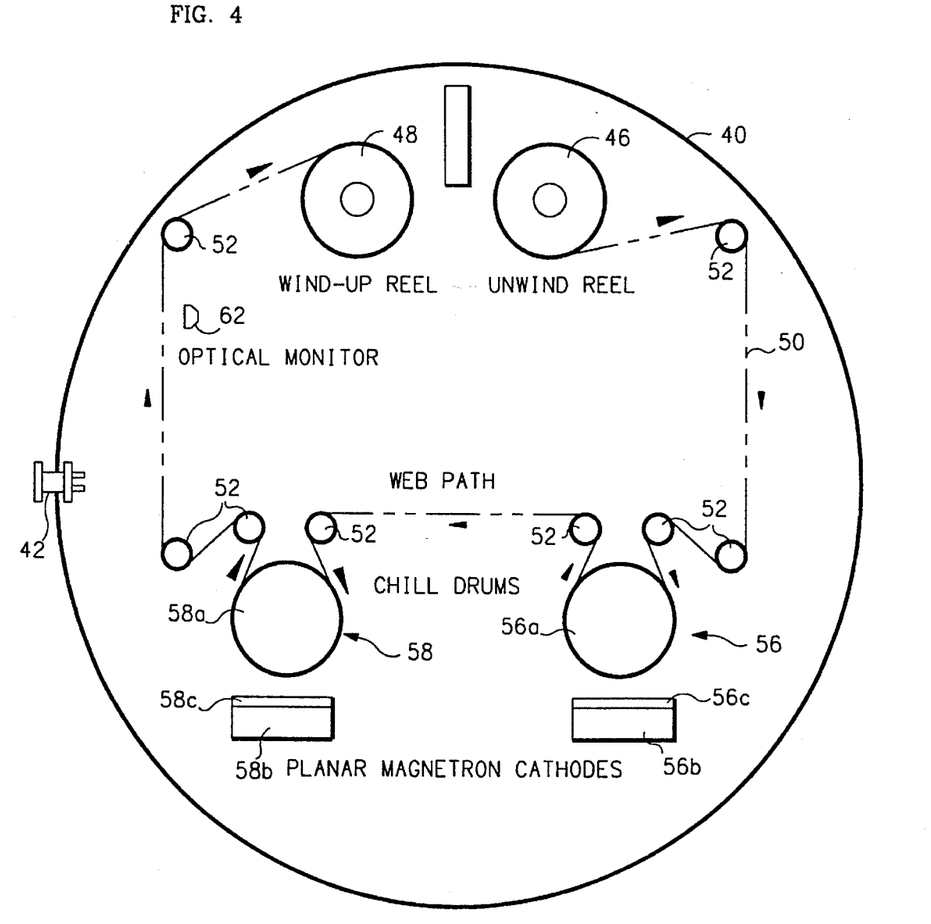
FIG. 4 is a schematic illustration of a reactive sputtering system preferred for practice of the invention.

Referring to FIG. 4, a conventional form of sputter deposition apparatus is comprised of a vacuum chamber 40 equipped with means (not shown) for evacuating the chamber and means 42 for introducing into the chamber an inert gas, such as argon, and/or a gas such as oxygen or nitrogen to be reacted with the target material for depositing a reacted compound coating on the web, e.g., an oxide or nitride of bismuth, tin, gallium and their alloys. The chamber is provided with an unwind reel 46 for receiving a roll of continuous web substrate material intended to be coated and a wind-up reel 48 for winding up the web of substrate material after it has been coated. The substrate web may comprise any material customarily used in sputtering operations, e.g., a polyester. As indicated by the dot-dash line, the web 50 is guided by a plurality of guide rollers 52 into and through at least one and preferably a plurality of web coating stations. In the illustrated apparatus, the coating stations include, in sequence in the direction of web travel, a first sputter deposition station 56 and a second sputter deposition station 58.

A variable speed web drive system (not shown) is provided to transport the web past the coating stations at a preselected speed, depending upon the coating characteristics desired. Typically, the whole roll of web material is coated and then removed from the chamber.

The two deposition stations 56 and 58 are preferably of the same construction and comprise, respectively, an internally chilled rotatable drum 56a, 58a of relatively large diameter for supporting and cooling the web and, below each drum, one or more horizontally mounted and upwardly facing planar magnetron cathodes 56b, 58b for sputter depositing a coating onto the web. Two sputter deposition stations are recommended so as to minimize the discharge requirements at each station, thereby to enhance the speed of the coating operation and the efficient cooling of the substrate material. Also, the space intervening between the two stations provides for a free run of the web so that additional cooling of the substrate may take place before the substrate reaches the second sputtering station. Due to the thinness and/or delicacy of some substrates, it may be further advisable that each sputtering station comprise a pair of planar magnetron cathodes so that sputter deposition of the coating is achieved in four stages or steps each of which is of relatively low dynamic intensity, i.e., two thin coatings (one-two) at the station 56 and two thin coatings (three-four) at the station 58.

An optical monitor 62 is provided downstream from the second station 58 to monitor the coated film and to ensure the proper thickness and composition of the coating on the substrate.

Figure 6:
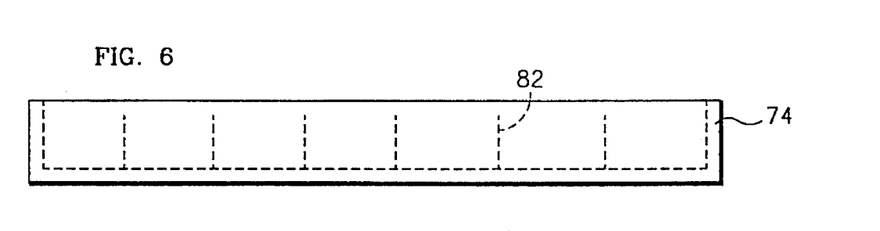
FIG. 6 is a side view of the preferred embodiment of the backplate incorporated in the assembly of Fig. 5.
Figure 7:
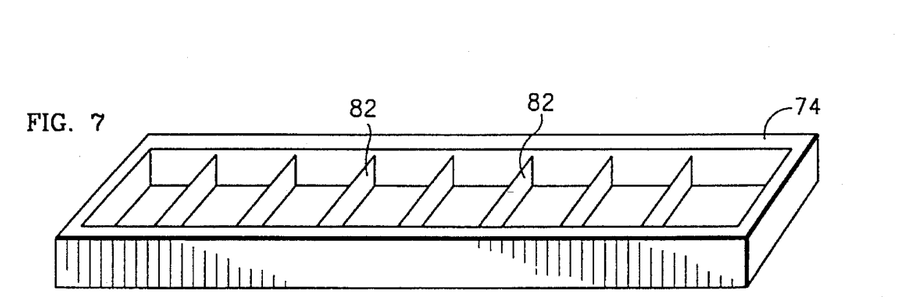
FIG. 7 is a perspective view of the backplate shown in FIG. 6.

In accordance with the present invention, the cathodes 56b, 58b are planar cathodes which are mounted horizontally beneath their respective chill drums and which, in the schematic illustration of FIG. 4, are shown as being provided respectively with pan-like backplates 56c, 58c. As shown in FIGS. 6–7, each backplate comprises an upwardly open pan for reception and confinement of a coating material in liquid or molten state.

If desired, solid target material may simply be placed in the pan-like backplate for subsequent melting during sputtering. Preferably, however, the cathode targets 56c, 58c are initially prepared by melting the target material, pouring the same into a backplate pan and letting the target material cool and solidify. Subsequently, when the targets are mounted to form part of the cathodes 56b, 58b and the sputtering process is started, the heat generated by the process will cause the target material to melt and thereafter to be sputtered in liquid or molten state. During operation, energy levels and cooling systems are correlated so as to heat up and maintain the target material at a temperature above its melting temperature, but below its violent boiling temperature, thereby to provide for sputtering of the target material in its liquid state throughout the course of coating deposition.

In use, the sputtering system is operated in conventional fashion to cause high energy ions to bombard the surface of the liquid target material to disintegrate the material atom-by-atom and to drive the same upwardly for relocation and deposition atom-by-atom onto the juxtaposed surface of the overlying drum supported portions of the web.

Ion bombardment of the surface of the coating material in its liquid state facilitates the use of much higher energy levels and thus results in a much faster rate of deposition than can be achieved when sputtering the same coating or target material in its solid state. This is especially true when the target material, e.g., bismuth, tin, gallium and their alloys, has a melting temperature in the order of or less than about 350° C.

For example, bismuth, which has a melting temperature of 271° C. and very poor thermal conductivity, cannot in its solid state be sputtered at an energy level, i.e., a power density level, much in excess of one watt per square centimeter. In contrast, in accordance with the invention, bismuth in its liquid state can be sputtered at a power density level of 10 to 20 watts per square centimeter. The increased power density enables deposition of coated films significantly more efficiently and economically.

However, when attempts are made (without benefit of the present invention) to reactively sputter liquid bismuth, tin, gallium and their alloys with oxygen or nitrogen, the process becomes unmanageable and unproductive. A hard crust or shell of an oxide or nitride of the metal forms on the surface of the liquid metal and the deposition rate drastically decreases to a commercially unacceptable level. Also, static charges build up at points on the crust and result in uncontrollable arcing that renders further processing totally unproductive.

The present invention resides in the discovery and development of a system for removing and disposing of particles of oxide or nitride crust as it forms on the surface of the molten metal and for maintaining an essentially clean molten metal surface so that the metal, i.e., tin, bismuth, gallium and their alloys, can be sputtered at very high power density levels, and reacted in the plasma cloud and at the substrate surface with oxygen or nitrogen, for efficient and effective deposition of a compound coating onto the substrate.

The system in its presently preferred embodiment resides in a specially designed magnetron cathode assembly which, in combination with the magnetic and sputtering forces extant within the sputtering chamber, provides an active self cleaning sputtering region of essentially clean liquid metal and lateral regions within which the oxide or nitride crust is collected and stored and wherein it is displaced and shielded from the plasma cloud so that it cannot itself cause arcing within the sputtering zone.

Thus, reactive sputtering deposition of oxides and nitrides of bismuth, tin, gallium and their alloys can be carried out at extremely high deposition rates to mass produce compound coated substrates in a commercially economical and efficient manner.

Figure 5:
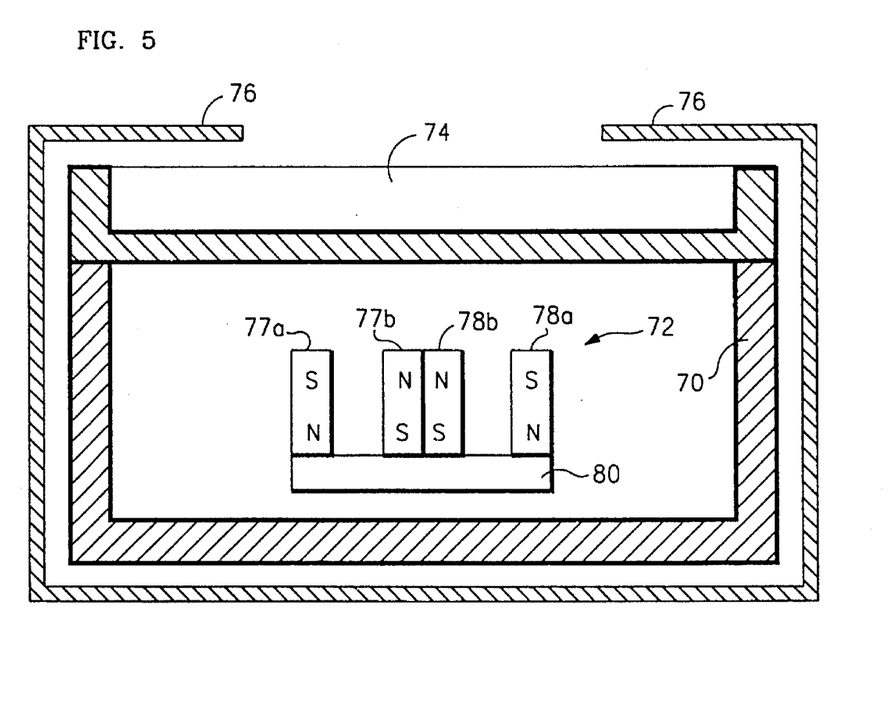
FIG. 5 is a vertical cross section of a preferred embodiment of cathode backplate and shield assembly provided in accordance with the invention.

Referring to FIG. 5, a preferred embodiment of the cathode assembly of the invention is shown as being comprised of an upwardly open elongate magnet housing or base 70, a magnetic field generating assembly 72 within the housing, a pan-like back plate 74 secured to and closing the top of the housing 70, and a grounded shield 76 extending around the bottom, sides and ends of the housing and backplate and over the top of the marginal edge portions of the pan defined by the backplate 74.

The magnetic field generating assembly 72 is preferably comprised of two pairs of spaced electromagnets 77a–77b and 78a–78b having oppositely facing poles shunted by a magnetic shunt 80 at the ends thereof remote from the backplate 74. Thus, when energized, the magnets generate two closely adjacent parallel magnetic fields extending through and along the length of the backplate. A coolant is continuously circulated in conventional manner through the interior of the housing 70 to cool the magnets and the lower surface of the backplate. Conventionally, the housing and backplate are made of copper because of its high thermal conductivity, and because it does not generate potential arcing risk in an oxygen or nitrogen plasma atmosphere.

A conventional size of planar magnetron backplate is 80 inches long and three to five inches wide. In accordance with the present invention, the width of the pan portion of the backplate 74 is increased to 8 to 10 inches and the grounded shield 76 extends 2 to 2½ inches over the pan immediately above all four of its marginal edges. The shield therefore covers the marginal 2 to 2½ inches of the target and defines a central ion access window that is about 75 to 76 inches long and about 3 to 6 inches wide, preferably 4 to 4½ inches wide.

The grounded shield 76 is spaced sufficiently outwardly from the housing and backplate to prevent electrical breakdown but not so far as to permit a plasma cloud to be developed between the shield and the backplate and destroy the shielding effect during sputtering. The actual spacing will be dependent upon the operating conditions of the sputtering process, but will typically be about ⅛ inch.

The pan defined by the backplate 74 is preferably about ½ inch deep to facilitate flow of liquid metal within the pan and is also provided along its base wall with a plurality of transverse weirs or curbs 82 to mitigate turbulence in the liquid flow.

The selected target metal, i.e., bismuth, tin, gallium, and their alloys, is preferably melted and poured into the pan, either in open air or a protected environment, and permitted to solidify prior to sputtering. Any oxide, nitride, or other impurities present in the molten metal can be skimmed from the surface prior to solidification so that an essentially clean elemental metal target is prepared for the sputtering process. Also, the sputtering process can initially be started with argon or another inert gas, without the reactive gas, and at low sputtering power further to clean the surface of the target while in its solid state.

After start up, the sputtering power is raised to melt the metal in the pan and the reactive gas is gradually introduced to commence reactive sputtering.

Due to the magnetic fields generated by the magnet pairs of the magnet assembly 72 and the dynamic sputtering forces, the liquefied metal in at least the central region of the pan will circulate along a path in the shape or configuration of a racetrack, as defined by the two magnetic fields. As discrete particles of oxide or nitride crust commence to form on the surface of the liquid, the crusty particulate is moved laterally outward away from the path of flow due to the dynamics of the flow and the cumulative forces of microscopic ion bombardments which have lateral momentum or force components. The floating oxide or nitride is thus pushed out of the flowing liquid stream and into the space or area beneath the portions of the shield 76 which overlie the marginal edge portions of the pan. Consequently, the racetrack path of circulation of the liquid metal, which is exposed to ion bombardment through the window defined by the shield 76, is kept clean and sputtering is confined to essentially pure elemental metal.

At the same time, the oxide or nitride residue is moved beneath the grounded shield and thus removed from the area occupied by the plasma cloud so that excessive static charges will not build up on the crust and unmanageable or uncontrollable arcing will not occur. The reactive sputtering process may therefore proceed without interruption. Also, sputtering proceeds at a high rate of deposition even at increasing partial pressures of the reactive gas because the oxide or nitride residue or crust does not impede the sputtering process.

Typical operating conditions for a quarter wavelength optical coating are as follows:

| | |
|---|---|
| Webspeed | 40–50 ft. per min. |
| Chamber Pressure | 10–20 millitorr |
| Power Density | 15 watts per sq. centimeter |
| Total Power | 80–100 kilowatts |
| Voltage | 400–500 volts |
| Target Surface Temperature | 400–500° C. |
| Coolant Inlet Temperature | 10–20° C. |

At very high sputtering powers, the circulation of the liquid metal in the pan has a tendency to become turbulent, which could be interruptive of the deposition of a uniform, metallurgically consistent and smooth coating on a substrate. By providing a relatively deep pan of liquid with immersed weirs or curbs 82, turbulence is controlled and a smooth liquid sputtering surface is maintained.

The process of the invention facilitates high speed, commercially practical deposition onto substrates of smooth and metallurgically consistent coatings composed of both conventional oxides and nitrides of bismuth, tin, gallium and their alloys, and synthesized oxides and nitrides of bismuth, tin, gallium, and their alloys, for example, a synthetic bismuth oxide having an atomic ratio of oxygen to bismuth of 1.7 or greater, i.e., $BiO_x$ ($x => 1.7$).

The objects and advantages of the invention have therefore been shown to be attained in a convenient, economical and practical manner.

While preferred embodiments of the invention have been herein illustrated and described, it is to be appreciated that various changes, rearrangements and modifications may be made therein without departing from the scope of the invention, as defined by the appended claims.

What is claimed is:

1. A process for enhancing magnetron cathode reactive sputtering of a low melting temperature metal with a reactive gas, comprising the steps of:

installing the metal as a horizontal, upwardly facing, planar magnetron cathode target in a magnetron cathode sputtering chamber;

applying sputtering power in the chamber to create an active sputtering zone;

melting the metal and confining the molten metal to the surface of the cathode for sputtering of the molten metal;

introducing the reactive gas into the sputtering chamber for reaction with the sputtered metal;

forming an inactive, non-sputtering zone in fluid communication with but outside of the active sputtering zone; and causing reaction products forming on the surface of the molten metal in the active sputtering zone to move into the inactive non-sputtering zone thereby to maintain a clean molten metal sputtering surface on the metal in the active sputtering zone and to reduce the potential for arcing.

2. A process as set forth in claim 1 wherein the metal is bismuth, tin, gallium, or their alloys and the reactive gas is oxygen or nitrogen.

3. A process for enhancing magnetron cathode reactive sputtering of a low melting temperature metal with a reactive gas, comprising the steps of:

installing the metal as a horizontal, upwardly facing, planar magnetron cathode target in a magnetron cathode sputtering chamber;

applying sputtering power in the chamber and creating a plasma cloud of ions and electrons within the chamber to cause positive ions to bombard the target;

melting the metal target and confining the molten metal to the surface of the cathode;

sputtering the molten metal;

introducing the reactive gas into the sputtering chamber for reaction with the sputtered metal;

shielding marginal portions of the target from the plasma cloud and ion bombardment; and causing reaction products forming on the surface of the unshielded portions of the molten metal target to be moved to and collected within said shielded marginal portions thereby to maintain a clean molten metal sputtering surface on the unshielded portions of the target and to reduce the potential for arcing.

4. A process as set forth in claim 3 wherein the metal is bismuth, tin, gallium, or their alloys and the reactive gas is oxygen or nitrogen.

5. A process as set forth in claim 3 including the steps of establishing a magnetic field within the molten metal in at least the unshielded portions of the target for inducing such molten metal to circulate in a predetermined path, the circulation of the molten metal in conjunction with the cumulative forces of ion bombardment causing reaction products formed on the surface of the circulating molten metal to move laterally into said shielded margin portions.

6. A process for magnetron cathode reactive sputtering of oxides and nitrides of low melting point metals chosen from bismuth, tin, gallium, and their alloys, comprising the steps of:

installing the metal as a horizontal, upwardly facing, planar magnetron cathode target in a magnetron cathode sputtering chamber;

evacuating the chamber;

applying sputtering power in the chamber to create an active sputtering zone;

melting the metal and confining the molten metal to the surface of the cathode;

sputtering the molten metal in the active sputtering zone;

introducing oxygen or nitrogen into the sputtering chamber for reaction with the sputtered metal;

forming an inactive, non-sputtering zone in fluid communication with but outside of the active sputtering zone and shielding the inactive non-sputtering zone from the active sputtering zone;

inducing circulation of the molten metal in the active sputtering zone; and causing oxides or nitrides forming on the surface of the molten bismuth, tin, gallium, or alloy thereof to be moved into the shielded inactive, non-sputtering zone thereby to maintain a clean molten metal sputtering surface in the active sputtering zone and to reduce the potential for arcing.

7. A process as set forth in claim 6 including the steps of establishing a magnetic field within the molten metal in at least the active sputtering zone for inducing such molten metal to circulate in a predetermined path, the circulation of the molten metal in conjunction with the cumulative forces of sputtering causing oxides or nitrides formed on the surface of the circulating molten bismuth, tin, gallium or alloy thereof to be moved into said shielded, non-sputtering zone.

8. The process as set forth in claim 7 including the step of establishing two closely adjacent parallel magnetic fields extending longitudinally of the planar target.

9. A process as set forth in claim 6 wherein the inactive, non-sputtering zone comprises the marginal edge portions of the target and a grounded shield extends over the marginal edge portions of the target for shielding the same from the plasma cloud generated during sputtering.

10. A process for magnetron cathode reactive sputter deposition of oxides and nitrides of low melting point metals chosen from bismuth, tin, gallium, and their alloys onto a web substrate within a magnetron cathode sputtering chamber which includes an unwind reel, a take-up reel, at least one chill drum and at least one planar magnetron cathode mounted horizontally below the chill drum, comprising the steps of:

mounting a roll of web substrate material onto the unwind reel in the magnetron cathode sputtering chamber;

guiding the web around the lower surface portions of the chill drum and onto the take-up reel;

installing the low melting point metal on the cathode as a horizontal, upwardly facing, planar magnetron cathode target;

evacuating the chamber;

introducing one or more gases into the evacuated chamber, at least one of which gases is oxygen or nitrogen;

moving the web through the chamber and around the chill drum;

circulating coolant through the cathode and the chill drum to chill the same and the drum supported web substrate;

applying sputtering power in the chamber and creating a plasma cloud of ions and electrons between the target and the drum supported portion of the web substrate to cause positive ions to bombard the target;

melting the metal target and confining the molten metal to the upper surface of the cathode;

sputtering the molten metal and depositing an oxide or a nitride of the metal onto the drum supported portion of the web substrate;

forming an inactive, non-sputtering zone in communication with the molten target and shielding the non-sputtering zone from the plasma cloud and ion bombardment; and causing oxides or nitrides forming on the surface of the molten metal to move into the shielded non-sputtering zone thereby to maintain a clean sputtering surface on the molten metal and to reduce the potential for arcing;

whereby coatings of oxides or nitrides of bismuth, tin, gallium, and their alloys may be deposited on the substrate at exceptionally high and consistent rates of deposition.

11. The process as set forth in claim 10 including the steps of wrapping the web of substrate material about the lower surfaces of at least two chill drums and sputtering molten target materials from at least two planar magnetron cathodes mounted respectively below the chill drums.

12. A process as set forth in claim 10 including the step of inducing circulation of the molten metal in a predetermined path, the circulation of the molten metal in conjunction with the sputtering forces causing oxides or nitrides forming on the surface of the molten metal to move into said shielded, non-sputtering zone.

13. A process as set forth in claim 12, including the step of establishing a magnetic field within the molten metal for inducing circulation of the molten metal during sputtering.

14. A process as set forth in claim 10, wherein the inactive, non-sputtering zone comprises the marginal edge portions of the target and a grounded shield extends over the marginal edge portions of the target for shielding the same from the plasma cloud generated during sputtering.

15. A process as set forth in claim 14, including the step of establishing a pair of closely adjacent parallel magnetic fields within the molten metal for inducing circulation of the molten metal in a racetrack configuration and for causing oxides and nitrides forming on the surface of the molten metal to move laterally into the shielded marginal edge portions of the target.

16. A process as set forth in claim 10, including the steps of first introducing an inert gas into the chamber and applying sufficient power in the chamber to melt the target and thereafter introducing oxygen or nitrogen into the chamber and increasing the power for reactively sputtering an oxide or nitride of bismuth, tin, gallium, and their alloys onto the drum supported portion of the web.

\* \* \* \* \*